(12) United States Patent
Newman et al.

(10) Patent No.: US 6,503,320 B1
(45) Date of Patent: Jan. 7, 2003

(54) REMOTE-CONTROL, CRYSTAL-ANNEALING, COLD-STREAM BLOCKING DEVICE AND METHOD

(75) Inventors: Janet Newman, Encinitas, CA (US); Jon A. Christopher, San Diego, CA (US); Brian L. Ganz, Carlsbad, CA (US); James A. Benjamin, Encinitas, CA (US)

(73) Assignee: Structural Genomix, Inc., San Diego, CA (US)

( * ) Notice: Subject to any disclaimer, the term of this patent is extended or adjusted under 35 U.S.C. 154(b) by 0 days.

(21) Appl. No.: 09/942,285

(22) Filed: Aug. 27, 2001

(51) Int. Cl.[7] ................................................ C30B 31/18
(52) U.S. Cl. ........................ 117/68; 117/69; 117/201; 117/202; 117/927
(58) Field of Search ............................ 117/68, 69, 201, 117/202, 927

(56) References Cited

PUBLICATIONS

"Flash–Cooling and Annealing of Protein Crystals"; Kriminiski, et al; ACTA Crystallographica Section D—Biological Crystallograry vol. 58, Part 3., pp. 459–471, Mar. 2002.*

* cited by examiner

Primary Examiner—Felisa Hiteshew
(74) Attorney, Agent, or Firm—Procopio, Cory, Hargreaves & Savitch, LLP

(57) ABSTRACT

A blocking device for remote, selective blocking of a cold stream used in a protein crystal annealing process during X-ray protein crystallography includes a blocking member adapted to be selectively moved between at least a blocking position where the blocking member blocks the cold stream and a non-blocking position where the blocking member does not block the cold stream, and an actuation mechanism adapted to impart movement to the blocking member to cause the blocking member to be selectively moved between at least the blocking position and the non-blocking position.

26 Claims, 3 Drawing Sheets

REMOTE-CONTROL, CRYSTAL-ANNEALING, COLD-STREAM BLOCKING DEVICE AND METHOD

FIELD OF THE INVENTION

The present invention relates to devices and methods for remote, selective blocking of a cold steam used in crystal annealing during X-ray protein crystallography.

BACKGROUND OF THE INVENTION

At the Advanced Photon Source, a national synchrotron radiation research center located at the Argonne National Laboratory near Chicago, Ill., a number of facilities exist for using diverted intense X-ray beamlines for visualization of an object using X-ray diffraction. One such use is for X-ray protein crystallography, i.e., the visualization of protein molecule crystals using X-ray diffraction. During X-ray protein crystallography, the technique of crystal annealing is performed. Crystal annealing includes warming a frozen protein crystal to room temperature, and then re-freezing it. This may allow the crystal to freeze more perfectly, and is commonly used to either rescue a poor initial freeze (e.g., one with ice rings that interfere with structural visualization of the protein) or to improve the diffraction properties of the frozen crystal. Two common techniques for performing crystal annealing involve either 1) re-introducing the crystal into cryoprotectant, or 2) merely blocking the stream of cold nitrogen gas which keeps the crystal frozen.

This second technique is generally preferred because of its simplicity. Traditionally, the cold stream is manually blocked by inserting a card such as a credit card between the crystal and the cold stream for a few seconds—until one can see the liquid around the crystal in the loop thaw—then removing the card. This manual blocking technique with a credit card has been satisfactory, but because there is not much room around the crystal in the setups used for protein crystallographic X-ray data collection, the crystal is frequently hit during the process, sometimes destroying the crystal.

This manual blocking technique requires the user to be in close proximity to the X-ray machine, but because of the high radiation levels of the emitted X-ray beams, the user can't be in close proximity to the X-ray machine while the X-ray machine is in use. As a result, the user must be sufficiently isolated from the intense X-rays emitted during X-ray crystallography, and must stop X-ray emission and undergo a time-consuming X-ray setup entry and exit process every time the user wants to perform the manual, cold-stream blocking technique during crystal annealing. Not only is the user limited in the amount of time that can be spent at the shared facility where X-ray protein crystallography is performed because of the high demand for the facility, but the hourly rental rate for the facility is expensive, currently renting at approximately $2000/hr. Thus, the time-consuming entry and exit process required every time one wants to manually block the cold stream increases the amount of time spent on crystal annealing and, hence, increases the amount of time spent performing X-ray protein crystallography.

Thus, a need exists for a way to block the cold stream used in crystal annealing during X-ray protein crystallography that solves one or more of the problems of the past.

SUMMARY OF THE INVENTION

The present invention includes a remote-control blocking mechanism to block the cold stream used in crystal annealing during X-ray protein crystallography that eliminates the aforementioned problems, including eliminating the danger of physically disturbing the crystal.

In an aspect of the invention, a blocking device for remote selective blocking a cold stream used in a protein crystal annealing process during X-ray protein crystallography includes a blocking member adapted to be selectively moved between at least a blocking position where the blocking member blocks the cold stream and a non-blocking position where the blocking member does not block the cold stream, and an actuation mechanism adapted to impart movement to the blocking member to cause the blocking member to be selectively moved between at least the blocking position where the blocking member blocks the cold stream and the non-blocking position where the blocking member does not block the cold stream. In a preferred implementation, the actuation mechanism includes a remotely located switch for controlling selective blocking of the cold stream from a remote location. In another implementation, the actuation mechanism includes a timer in place of, or in addition to, the remotely located switch.

Another aspect of the invention involves a method of remote, selective blocking of a cold stream used in a protein crystal annealing process during X-ray protein crystallography. The method includes providing a remotely actuatable blocking device adjacent the cold stream, the blocking device including a blocking member adapted to be selectively moved between at least a blocking position where the blocking member blocks the cold stream and a non-blocking position where the blocking member does not block the cold stream, and an actuation mechanism adapted to impart movement to the blocking member to cause the blocking member to be selectively moved between at least the blocking position where the blocking member blocks the cold stream and the non-blocking position where the blocking member does not block the cold stream; and actuating the actuation mechanism from a remote location to impart movement to the blocking member to cause the blocking member to be selectively moved between at least the blocking position where the blocking member blocks the cold stream to allow the protein crystal to be warmed and the non-blocking position where the blocking member does not block the cold stream to allow the protein crystal to be cooled.

These and further objects and advantages will be apparent to those skilled in the art in connection with the drawing and the detailed description of the preferred embodiment set forth below.

DETAILED DESCRIPTION OF THE PREFERRED EMBODIMENT

Figure 1:
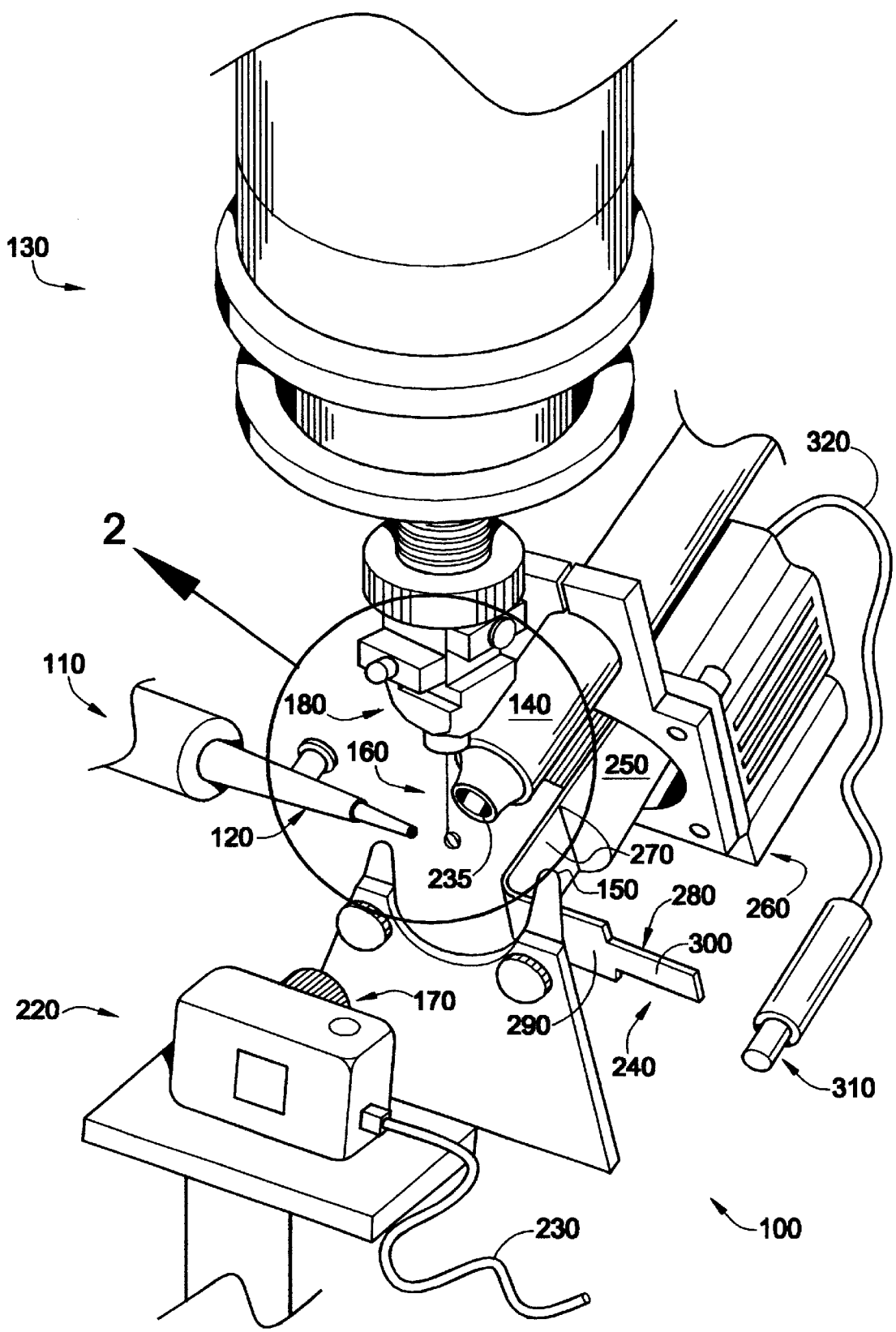
FIG. 1 is a perspective view of an exemplary X-ray protein crystallography set-up and a remote-control, cold-stream blocking device constructed in accordance with an embodiment of the invention.

With reference to FIG. 1, a remote-control, cold-stream blocking device 100 constructed in accordance with an embodiment of the invention will now be described. The blocking device 100 is preferably used to selectively block the cold stream used during crystal annealing when performing X-ray protein crystallography of a protein crystal. The blocking device 100 may be used to block the cold stream used during crystal annealing of other types of biological macromolecules other than proteins or other types of crystallizable substances. An exemplary X-ray protein crystallography set-up 110 that the blocking device 100 may be used with will first be described, followed by a description of the blocking device 100 and a method of using the blocking device 100. Other crystallography set-ups 110 other than that shown and described herein may be used.

The X-ray protein crystallography set-up 110 includes a collimeter 120, a gonimeter 130, a cryostream source 140, a beam stop 150, a protein crystal holder 160, and a camera head 170. Each of these components of the X-ray protein crystallography set-up 110 will be briefly described in turn.

The collimeter 120 is an X-ray barrel for directing intense X-ray radiation beamlines at a protein crystal carried by the holder 160 for visualization of the crystal using X-ray diffraction.

The gonimeter 130 is used to precisely hold the protein crystal and move it relative to the other components of the X-ray protein crystallography set-up 110. The gonimeter 130 includes a gonimeter head 180 that carries the protein crystal holder 160.

The cryostream source 140 directs a cold stream (e.g., cold nitrogen gas) at the protein crystal to maintain the protein crystal in a frozen condition or to re-freeze the crystal.

The beam stop 150 serves as a backstop for the intense X-ray radiation beamlines delivered by the collimeter 120.

Figure 2:
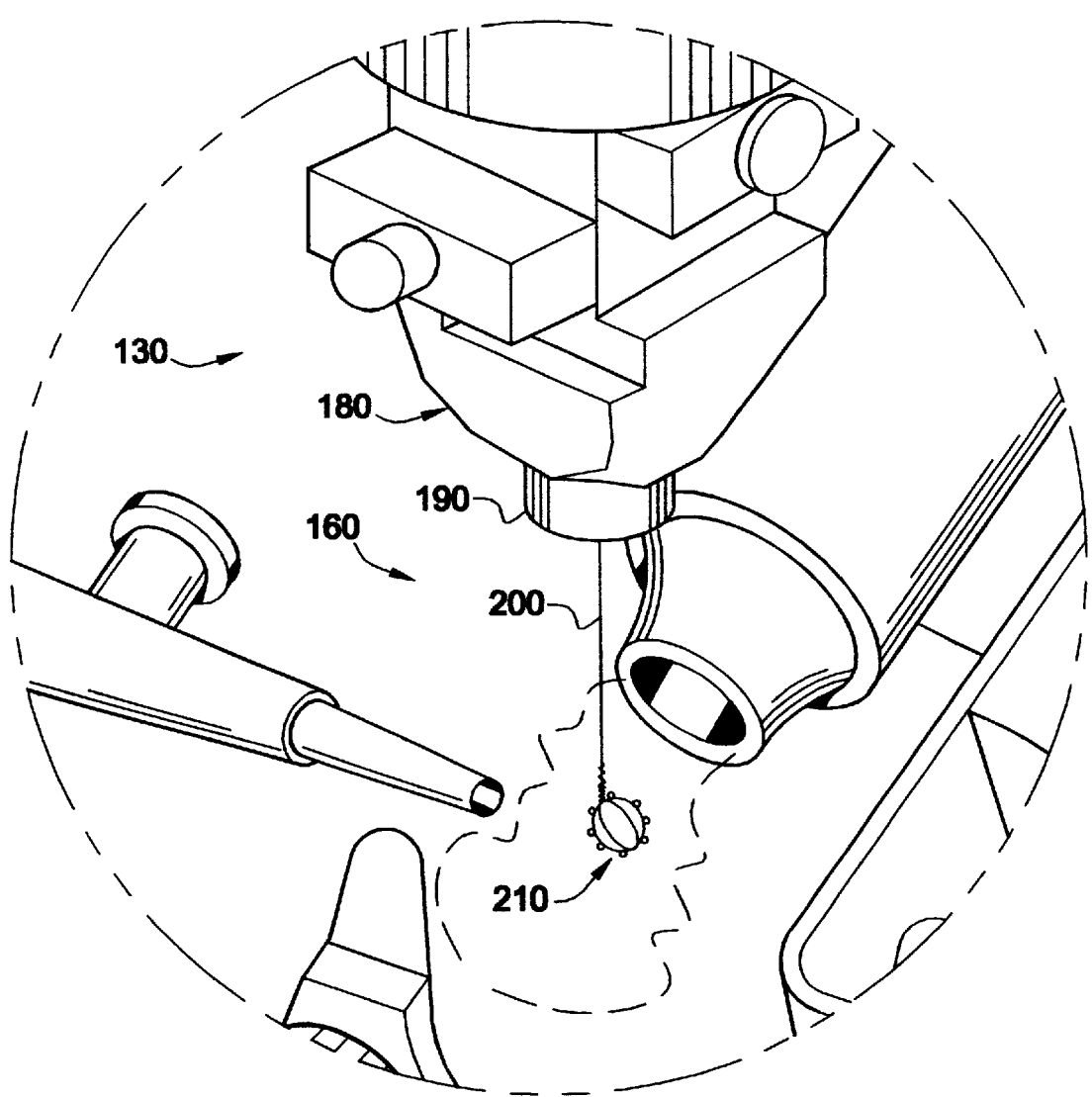
FIG. 2 is an enlarged perspective view of the area denoted as 2 in FIG. 1.

With reference additionally to FIG. 2, the protein crystal holder 160 may include a cap 190, a thin metal shaft 200, and a nylon loop 210. The cap 190 fits onto the gonimeter head 180 for attaching the protein crystal holder 160 to the gonimeter 130. The loop 210 carries the protein crystal.

With reference back to FIG. 1, the camera head 170 is part of a video camera 220 for visualizing the protein crystal. The camera 220 is connected to a video monitor (not shown) through a cord or cable 230 for close-up viewing of the images of the protein crystal obtained by the camera head 220. The camera 220 may be part of, or connected with, a computer for viewing the protein crystal on a computer monitor.

Figure 3:
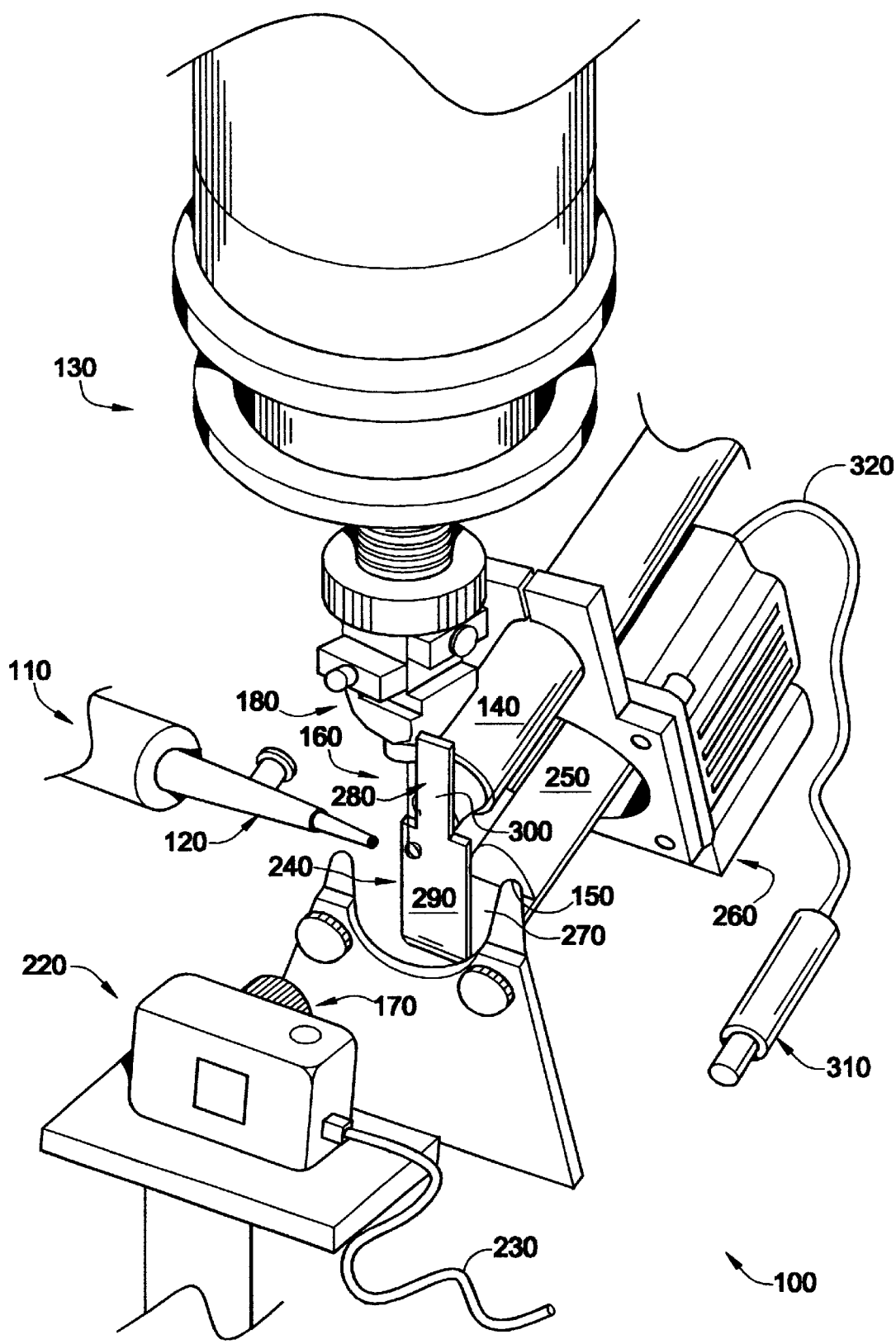
FIG. 3 is a perspective view, similar to FIG. 1, showing an embodiment of a blocking member of the device in a position where it blocks the cold steam emitted from the X-ray protein crystallography set-up.

With reference to FIGS. 1–3, the remote-control, cold-stream blocking device 100 will now be described in more detail. The blocking device 100 is mounted near an end 235 of the cryostream source 140. The blocking device 100 includes a blocking member in the form of a blocking arm 240 connected to a rotatable shaft 250 of an actuation mechanism in the form of a DC servo motor 260.

The blocking arm 240 includes a first arm portion 270 and a second arm portion 280. The second arm portion 280 extends perpendicularly from the first arm portion 270. The second arm portion 280 includes a wide section 290 and a narrow blocking section 300.

A motor actuation switch 310 is connected to the DC servo motor 260 by a cord or cable 320. The DC servo motor 260 is operated remotely by a user using the switch 310 to selectively block the cold stream emitted by the cryostream source 140 with the blocking arm 240. Operating the switch 310 causes DC servo motor 260 to move the blocking arm 240 back and forth between the blocking position illustrated in FIG. 3 where the narrow blocking section 300 blocks the cold stream emitted by the cryostream source 140 and the non-blocking position illustrated in FIG. 1 where the blocking arm 240 does not block the cold stream.

Although the remote-control, cold-stream blocking device 100 is described as a blocking arm 240 connected to a rotatable shaft 250 of a DC servo motor 260, in alternative embodiments, the blocking member of the blocking device 100 may take any form that 1) fits between the cryostream source 140 and the sample, and 2) adequately blocks the cold stream flow to the sample. For example, but not by way of limitation, the blocking device 100 may comprise a controllable, shutter similar to a shutter on a camera that may be selectively closed or opened to block or not block the cold stream from the cryostream source 140. In alternative embodiments, the blocking member may move in a direction or orientation including at least one of radially, laterally, vertically, forward, and rearward to selectively block the cold stream from the cryostream source 140. Other actuation mechanisms other than a motor may be used to impart movement to a blocking member such as, but not by way of limitation, a solenoid, an air cylinder, and a spring. The actuation switch 310 may have a wired connection to the actuation mechanism (e.g., motor 260) or a wireless connection (e.g., infrared). Instead of, or in addition to, blocking the cold stream, the cold stream source may be moved or the cold stream may be diverted to allow crystal annealing. For example, an actuation mechanism may be selectively controlled from a remote location to move the cryostream source 140 so that the cold stream is not directed at the protein crystal sample. Further, a fluid source may be used to selectively divert the cold stream. The fluid source may be directed at the cold stream and be located to the side and in front of the cryostream source 140. The fluid source may be actuated from a remote location to cause the cold stream to be diverted so that the cold stream is not directed at the crystal sample.

In another implementation, the actuation mechanism may include a timer in place of, or in addition to, the remotely located switch 310 for blocking and non-blocking the cold stream based on predetermined and/or user selectable time periods.

The remote-control, cold-stream blocking device 100 will now be described in use. During X-ray protein crystallography, crystal annealing is performed. Crystal annealing includes warming a frozen protein crystal to room temperature, and then refreezing it. This may allow the crystal to freeze more perfectly, and is commonly used to either rescue a poor initial freeze (e.g., one with ice rings that interfere with structural visualization of the protein) or to improve the diffraction properties of the frozen crystal. The cryostream source 140 supplies a cold stream of cold nitrogen gas to freeze the protein crystal or maintain the crystal in a frozen condition. The remote-control, blocking device 100 is used to selectively block the nitrogen gas cold stream so that the frozen protein crystal can be warmed by the ambient room-temperature air during the crystal annealing process. Because the collimeter 120 emits an intense, high-radiation X-ray beam, the user(s) of the machine are located remotely with respect to the set-up 110 during X-ray protein crystallography. The user operates the motor actuation switch 310 remotely from the X-ray protein crystallography set-up 110 to control operation of the DC servo motor 260. By operating the switch 310, the user causes the DC servo motor 260 to move the blocking arm 240 to the blocking position illustrated in FIG. 3, where the narrow blocking section 300 blocks the cold stream emitted by the cryostream source 140. The blocking section 300 is maintained in this position to block the cryostream source 140 until the user determines the protein crystal has melted a sufficient amount. The camera 220 and an associated monitor may be used to visualize the crystal for determining when to block the cryostream or prevent blocking of the cryostream. The user operates the switch 310 again to cause the DC servo motor 260 to move the blocking arm 240 to the disengaged position illustrated in FIG. 1, where the cryostream is unobstructed. The re-freezing or maintained freezing of the crystal may be visualized with the camera 220 and the associated monitor. If too many ice rings form on the protein crystal during re-freezing, the above-described process may repeated one or more times.

Thus, the remote-control, cold-stream blocking device 100 allows the user to selectively block the cold stream during crystal annealing from a remote location relative to the X-ray protein crystallography set-up 110. This is advantageous over the prior art method of manually inserting a credit card by hand in front of the cold stream to allow the protein crystal to warm. As shown in FIGS. 1–3, not much room exists in the area of the protein crystal in the X-ray protein crystallography set-up 110 to insert a credit card. Manually blocking the stream with a credit card increases the risk of hitting and destroying the crystal during the blocking process. In addition to the risk of hitting the crystal, the manual blocking procedure requires the user to enter and exit the work area each time one desires to block the cold stream during crystal annealing. This is time-consuming and, hence, expensive because the facility where X-ray protein crystallography is performed is rented at approximately $2000/hr. Also, because the facility where X-ray diffraction is performed is shared, users are limited in the amount of time they can spend there. Having to perform a time-consuming manual blocking procedure during crystal annealing increases the overall time each X-ray protein crystallography procedure takes, reducing the number of X-ray protein crystallography procedures performed during a given time period.

It will be readily apparent to those skilled in the art that still further changes and modifications in the actual concepts described herein can readily be made without departing from the spirit and scope of the invention as defined by the following claims.

What is claimed is:

1. A method of remote, selective blocking of a cold stream used in a protein crystal annealing process during X-ray protein crystallography, comprising:

providing a remotely actuatable blocking device adjacent the cold stream, the blocking device including a blocking member adapted to be selectively moved between at least a blocking position where the blocking member blocks the cold stream and a non-blocking position where the blocking member does not block the cold stream, and an actuation mechanism adapted to impart movement to the blocking member to cause the blocking member to be selectively moved between at least the blocking position where the blocking member blocks the cold stream and the non-blocking position where the blocking member does not block the cold stream;

actuating the actuation mechanism from a remote location to impart movement to the blocking member to cause the blocking member to be selectively moved between at least the blocking position where the blocking member blocks the cold stream to allow the protein crystal to be warmed and the non-blocking position where the blocking member does not block the cold stream to allow the protein crystal to be cooled.

2. The method of claim 1, wherein the blocking member is a blocking arm and the actuation mechanism is a motor that imparts rotational movement to the blocking arm.

3. The method of claim 1, wherein X-ray protein crystallography of a protein crystal occurs in an area, the actuation mechanism includes a switch that is located remotely from the area where X-ray protein crystallography of the protein crystal occurs, and the switch is operable to cause the blocking member to be selectively moved from at least the blocking position where the blocking member blocks the cold stream and the non-blocking position where the blocking member does not block the cold stream.

4. The method of claim 3, wherein the blocking device further includes a timer, and the method further includes using the timer to control blocking and non-blocking of the cold stream.

5. The method of claim 1, wherein the blocking member is a shutter.

6. The method of claim 1, wherein the blocking member moves in a direction from the group consisting of radial, vertical, horizontal, forward, and rearward.

7. The method of claim 1, wherein the actuation mechanism is a solenoid.

8. The method of claim 1, wherein the actuation mechanism is an air cylinder.

9. The method of claim 1, wherein the actuation mechanism is a spring.

10. A method of crystal annealing a protein crystal sample during X-ray protein crystallography, comprising:

freezing a protein crystal sample with a cryostream; and preventing the freezing of the protein crystal sample from a remote location.

11. The method of claim 10, wherein preventing the freezing of the protein crystal sample includes blocking the cryostream.

12. The method of claim 10, wherein preventing the freezing of the protein crystal sample includes diverting the cryostream.

13. The method of claim 11, wherein preventing the freezing of the protein crystal sample includes moving a cryostream source so that the cryostream is not directed at the protein crystal sample.

14. A blocking device for remote selective blocking of a cold stream used in a protein crystal annealing process during X-ray protein crystallography, comprising:

a blocking member adapted to be selectively moved between at least a blocking position where the blocking member blocks the cold stream and a non-blocking position where the blocking member does not block the cold stream; and an actuation mechanism adapted to impart movement to the blocking member to cause the blocking member to be selectively moved between at least the blocking position where the blocking member blocks the cold stream and the non-blocking position where the blocking member does not block the cold stream.

15. The blocking device of claim 14, wherein the blocking member is a blocking arm and the actuation mechanism is a motor that imparts rotational movement to the blocking arm.

16. The blocking device of claim 14, wherein X-ray protein crystallography of a protein crystal occurs in an area, the actuation mechanism includes a switch that is located remotely from the area where X-ray protein crystallography of the protein crystal occurs, and the switch is operable to cause the blocking member to be selectively moved from at least the blocking position where the blocking member blocks the cold stream and the non-blocking position where the blocking member does not block the cold stream.

17. The blocking device of claim 14, wherein the blocking member is a shutter.

18. The blocking device of claim 14, wherein the blocking member moves in a direction from the group consisting of radial, vertical, horizontal, forward, and rearward.

19. The blocking device of claim 14, wherein the actuation mechanism is a solenoid.

20. The blocking device of claim 14, wherein the actuation mechanism is an air cylinder.

21. The blocking device of claim 14, wherein the actuation mechanism is a spring.

22. The blocking device of claim 14, further including a timer to control blocking and non-blocking of the cold stream.

23. A blocking device for selective blocking of a cold stream used in a protein crystal annealing process during X-ray protein crystallography, comprising:
   a blocking member adapted to be selectively.moved between at least a blocking position where the blocking member blocks the cold stream and a non-blocking position where the blocking member does not block the cold stream;
   an actuation mechanism adapted to impart movement to the blocking member to cause the blocking member to be selectively moved between at least the blocking position where the blocking member blocks the cold stream and the non-blocking position where the blocking member does not block the cold stream; and
   a timer to cause the actuation mechanism to block and not to block the cold stream based on time.

24. The blocking device of claim 23, wherein the timer causes the actuation mechanism to block and not to block the cold stream based on one or more predetermined time periods.

25. The blocking device of claim 23, wherein the timer causes the actuation mechanism to block and not to block the cold stream based on one or more user selectable time periods.

26. The blocking device of claim 23, wherein X-ray protein crystallography of a protein crystal occurs in an area, the actuation mechanism includes a switch that is located remotely from the area where X-ray protein crystallography of the protein crystal occurs, and the switch is operable to cause the blocking member to be selectively moved from at least the blocking position where the blocking member blocks the cold stream and the non-blocking position where the blocking member does not block the cold stream.

* * * * *

UNITED STATES PATENT AND TRADEMARK OFFICE
CERTIFICATE OF CORRECTION

PATENT NO. : 6,503,320 B1
DATED : January 7, 2003
INVENTOR(S) : Newman et al.

It is certified that error appears in the above-identified patent and that said Letters Patent is hereby corrected as shown below:

Column 1,
Line 7, delete "steam" and insert -- stream --;

Column 2,
Line 60, delete "steam" and insert -- stream --; and

Column 5,
Line 14, after "may" insert -- be --.

Signed and Sealed this

First Day of June, 2004

JON W. DUDAS
*Acting Director of the United States Patent and Trademark Office*